(12) United States Patent
Hellmann

(10) Patent No.: US 11,807,118 B2
(45) Date of Patent: Nov. 7, 2023

(54) METHOD AND DEVICE FOR OPERATING A VOLTAGE CONVERTER

(71) Applicants: Robert Bosch GmbH, Stuttgart (DE); Mechthild Hellmann, Hardthof (DE)

(72) Inventor: Manfred Hellmann, Hardthof (DE)

(73) Assignee: Robert Bosch GmbH, Stuttgart (DE)

( * ) Notice: Subject to any disclaimer, the term of this patent is extended or adjusted under 35 U.S.C. 154(b) by 716 days.

(21) Appl. No.: 16/772,898

(22) PCT Filed: Nov. 9, 2018

(86) PCT No.: PCT/EP2018/080772
§ 371 (c)(1),
(2) Date: Jun. 15, 2020

(87) PCT Pub. No.: WO2019/115102
PCT Pub. Date: Jun. 20, 2019

(65) Prior Publication Data
US 2020/0353829 A1    Nov. 12, 2020

(30) Foreign Application Priority Data
Dec. 14, 2017   (DE) ..................... 10 2017 222 797.4

(51) Int. Cl.
*B60L 53/20*        (2019.01)
*B60L 3/00*         (2019.01)
(Continued)

(52) U.S. Cl.
CPC ............. *B60L 53/20* (2019.02); *B60L 3/0038* (2013.01); *B60L 3/0092* (2013.01); *B60L 3/04* (2013.01);
(Continued)

(58) Field of Classification Search
CPC ........ B60L 53/20; B60L 3/04; B60L 2210/10; B60L 2240/525; B60W 50/0205; B60W 50/023; H02H 7/1213
(Continued)

(56) References Cited

U.S. PATENT DOCUMENTS

2015/0103450 A1   4/2015  Fox et al.
2015/0258947 A1   9/2015  Harkins
(Continued)

FOREIGN PATENT DOCUMENTS

JP    2009255685    11/2009
WO    2012118625    9/2012

OTHER PUBLICATIONS

Machine translation Akio et al. (Year: 2013).*
(Continued)

*Primary Examiner* — Jacob S. Scott
*Assistant Examiner* — Michael E Butler
(74) *Attorney, Agent, or Firm* — Michael Best & Friedrich LLP

(57) ABSTRACT

The invention relates to a device for operating a voltage converter (1), in particular a DC converter, of a motor vehicle, which voltage converter has at least two parallel-connected converter strands (4, 5) which are connected between a high-voltage side (2) and a low voltage side (3) of the voltage converter (1) for converting the voltage, having at least one cooling device (8) carrying a coolant (9) and assigned to the converter strands (4, 5), wherein each of the converter strands (4, 5) is assigned at least one temperature sensor (6, 7), comprising the following steps: a) detecting an input voltage, an output voltage and an operating current of each converter strand (4, 5), b) detecting a current converter strand temperature by means of the respective temperature sensor (6, 7), c) determining a respective cool-
(Continued)

ant temperature as a function of the values detected in steps a) and b), d) comparing the two determined coolant temperatures (T_1, T_2) with each other and e) determining the serviceability of the temperature sensors (6, 7) on the basis of the result of the comparison.

8 Claims, 2 Drawing Sheets

(51) Int. Cl.
    *B60L 3/04*     (2006.01)
    *B60L 3/06*     (2006.01)
    *B60W 50/02*     (2012.01)
    *B60W 50/023*     (2012.01)
    *H02H 7/12*     (2006.01)
    *H05K 7/20*     (2006.01)
    *H02M 1/32*     (2007.01)

(52) U.S. Cl.
    CPC ............. *B60L 3/06* (2013.01); *B60W 50/023* (2013.01); *B60W 50/0205* (2013.01); *H02H 7/1213* (2013.01); *H05K 7/20945* (2013.01); *B60L 2210/10* (2013.01); *B60L 2240/525* (2013.01); *H02M 1/325* (2021.05); *H02M 1/327* (2021.05)

(58) Field of Classification Search
    USPC .......................................................... 701/22
    See application file for complete search history.

(56) References Cited

U.S. PATENT DOCUMENTS

| | | |
|---|---|---|
| 2016/0105105 A1 | 4/2016 | Choi |
| 2017/0129350 A1* | 5/2017 | Mitsutani ................ B60L 50/62 |
| 2017/0288593 A1 | 10/2017 | Suzuki et al. |
| 2018/0166967 A1* | 6/2018 | Hirano ................... H02M 3/158 |
| 2019/0072624 A1* | 3/2019 | Biber .................... G01R 33/583 |

OTHER PUBLICATIONS

International Search Report for Application No. PCT/EP2018/080772 dated Apr. 11, 2019 (English Translation, 3 pages).

* cited by examiner

METHOD AND DEVICE FOR OPERATING A VOLTAGE CONVERTER

BACKGROUND OF THE INVENTION

The invention relates to a method for operating a voltage converter, in particular a DC/DC converter of a motor vehicle, having at least two converter strands which are connected in parallel and are connected between a high-voltage side and a low-voltage side of the voltage converter for converting the voltage, having at least one cooling device which carries a coolant and is assigned to the converter strands, wherein at least one temperature sensor for capturing a converter temperature in each case is assigned to each of the converter strands.

The invention also relates to a device for operating such a voltage converter.

A DC/DC converter which converts the high voltage provided by a traction battery into a low voltage for the vehicle electrical system is used to produce the (low) voltage in the vehicle electrical system of a motor vehicle in the case of motor vehicles which also have an electrical drive machine. As a result of this, an energy store (battery) does not need to be respectively provided for the vehicle electrical system and the traction system, but rather the one energy store of the traction system suffices.

In order to increase the possible uses and failure safety, voltage converters having two converter strands connected in parallel with one another are known. The two converter strands generally have an identical design and can convert the low voltage into high voltage alone or together. Depending on a power requirement, the converter strands are operated individually or together, for example.

Heat loss is produced during operation of the voltage converter and results in heating of the electrical components of the converter strands themselves, on the one hand, and of electrical components adjacent to the converter strands, on the other hand. In order to avoid overheating of the electrical components and also of the converter strands, it is known practice to assign a cooling device to the converter strands, which cooling device carries a coolant which is used to remove the heat loss produced. In particular, the same coolant is supplied to both converter strands or the cooling device serves both converter strands. For this purpose, the converter strands are behind one another in the direction of flow of the coolant, for example.

As a further component protective measure, it is known practice to assign a separate temperature sensor to each of the converter strands. For example, the cooling performance of the cooling device can be optimized on the basis of the temperatures captured by the temperature sensors.

SUMMARY OF THE INVENTION

The method according to the invention has the advantage that the functionality of the temperature sensors is diagnosed during operation. It can therefore be ensured during ongoing operation that the temperature sensors are functioning properly and overheating of the components can consequently be avoided. Since the two converter strands can be operated with different powers, different power losses and therefore different temperatures can also arise in the individual components of the converter strands. This results in the temperature sensors of the individual converter strands being able to capture different temperatures. As a result, a comparison of the temperatures with one another will not allow a statement on the functionality of the temperature sensors.

Therefore, the following procedure is provided according to the invention in order to nevertheless enable a reliable functional diagnosis: in a first step a), an input voltage, an output voltage and operating current of each converter strand are captured. Sensors required for this purpose are usually already present in voltage converters, with the result that it is possible to resort to data which are already available. Furthermore, in a second step b), an instantaneous converter strand temperature is captured by means of the respective temperature sensor. Two temperature values are therefore available. In a subsequent step c), a coolant temperature is determined for each converter strand on the basis of the values captured in steps a) and b). For example, the coolant temperature can be calculated in a simple manner on the basis of the values mentioned by using a temperature model. In a step d), the two determined coolant temperatures are then compared with one another and, in a step e), the functionality of the temperature sensors is determined on the basis of the result of the comparison. With knowledge of the structure of the voltage converter, it is possible to determine the respective coolant temperature in a comparatively accurate manner. Since it is assumed that the coolant is supplied to both converter strands, the temperature of the coolant would have to be virtually the same on both converter strands. In particular, this is the case if the coolant is supplied to both converter strands in a parallel manner. If the coolant is supplied to the converter strands in succession, a temperature difference from one converter strand to the next converter strand can already be established. However, this temperature difference can be removed on the basis of the values mentioned above or can be taken into account, for example, during a comparison of the determined coolant temperatures, for example by means of a tolerance value. It is therefore possible to easily diagnose the temperature sensors by comparing the determined coolant temperatures which would have to be the same or virtually the same as one another, in particular if the coolant is supplied in a parallel manner.

In particular, the coolant temperatures are calculated by means of a temperature model in each case, as already mentioned above. This ensures prompt and simple calculation of the coolant temperatures.

Furthermore, provision is preferably made for the functionality of the temperature sensors to be identified when the determined coolant temperatures are the same or virtually the same.

In particular, a functional fault of one of the temperature sensors is identified when the determined coolant temperatures differ from one another beyond a predefinable limit value. In this case, the limit value is selected, in particular, on the basis of whether the coolant is applied to the converter strands in succession or in a parallel manner. If the coolant is applied to the converter strands in succession, the limit value is preferably selected to be greater than when the coolant is applied in a parallel manner because the coolant may already have been heated by the converter strand which is upstream in the direction of flow as a result of the different power losses of the converter strands.

Furthermore, provision is preferably made for the voltage converter or a control unit having the voltage converter to be switched to safe emergency operation if a functional fault is identified. This ensures the safety, in particular the driving safety and the personal safety, of the motor vehicle.

Furthermore, provision is preferably made for a further coolant temperature to be captured and to be compared with the determined coolant temperatures in order to determine which of the two temperature sensors has a malfunction. The further coolant temperature can be determined, for example, by means of a separate control unit and/or the cooling device itself. It is therefore used as a reference value for the coolant temperatures determined by means of the temperature sensors in step c). As a result, it is not only possible to determine overall that there is a malfunction in one of the temperature sensors, but rather it is possible to identify which of the two temperature sensors has the malfunction. Consequently, the converter strand affected by the functional fault is deactivated for the emergency operating mode, for example, and continued operation of the voltage converter by means of the remaining converter strand is ensured.

Furthermore, provision is preferably made for the further coolant temperature to be measured. As a result, particularly accurate capture of the coolant temperature is ensured and a reliable comparison with the coolant temperatures determined in step c) can be carried out.

The device according to the invention is distinguished by the fact that it is in the form of a control unit which is specifically configured to carry out the method according to the invention. The advantages which have already been mentioned result from this.

BRIEF DESCRIPTION OF THE DRAWINGS

Further advantages and preferred features and combinations of features emerge, in particular, from the description above and from the claims.

The invention shall be explained in more detail below on the basis of the drawing, in which.

DETAILED DESCRIPTION

Figure 1:
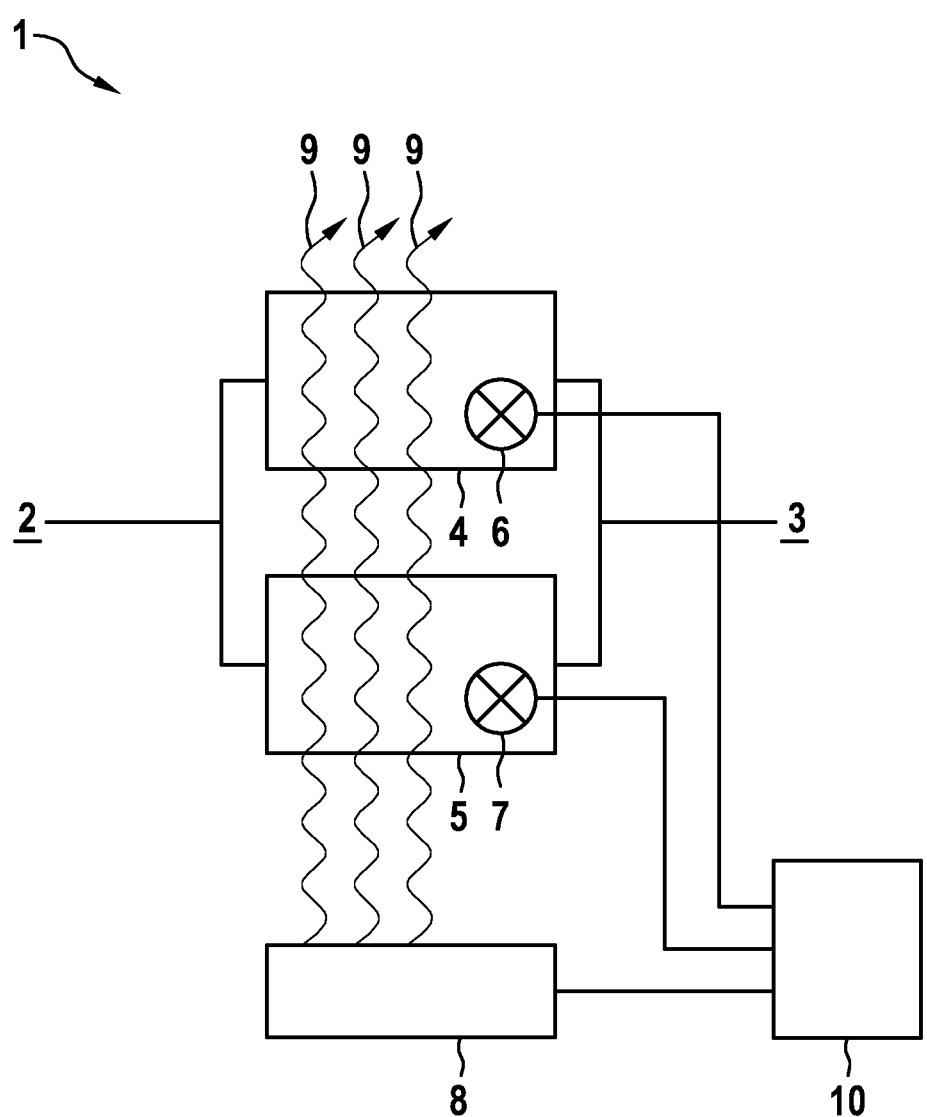
FIG. 1 shows a simplified illustration of a voltage converter.

FIG. 1 shows a simplified illustration of an advantageous voltage converter 1 which is connected between a high-voltage side 2 and a low-voltage side 3 in order to supply the low-voltage side with energy from the high-voltage side 2. In the present case, this is a voltage converter 1 of a motor vehicle which is in the form of an electric vehicle or a hybrid vehicle and has at least one electrical drive machine which is fed from the high-voltage network 2 by a traction battery. The voltage converter 1 means that the low-voltage network, which forms, for example, the vehicle electrical system of the motor vehicle with a voltage of 12 to 14 V, does not require its own energy store.

The advantageous voltage converter 1 has two converter strands 4 and 5 which are connected in parallel with one another. The converter strands 4, 5 have a substantially identical design and preferably each have a DC/DC converter. In addition, each of the converter strands 4, 5 has a temperature sensor 6, 7 which is used to monitor the temperature of the respective converter strand 4, 5.

In addition, the voltage converter 1 is assigned a cooling device 8 which conveys a coolant which is applied to both converter strands 4, 5 in order to dissipate heat loss produced during operation. According to the present exemplary embodiment, the coolant 9, which is shown by arrows in FIG. 1, is applied to the converter strands 4, 5 in succession. The coolant 9 may be, for example, a coolant fluid or a coolant gas flow, in particular an air flow.

A control unit 10 is advantageously also present and is connected to the temperature sensors 6, 7, to the cooling device 8 and to the converter strands 4, 5 in order to operate the voltage converter 1. In particular, the control unit 10 controls the cooling device 8, for example, on the basis of the temperature values determined by the temperature sensors 6, 7 in order to ensure optimum operation of the converter strands 4, 5.

In order to monitor the temperature sensors 6, 7 for faults or malfunctions, the control unit 10 also carries out an advantageous diagnosis which shall be explained in more detail below with reference to FIG. 2.

Figure 2:
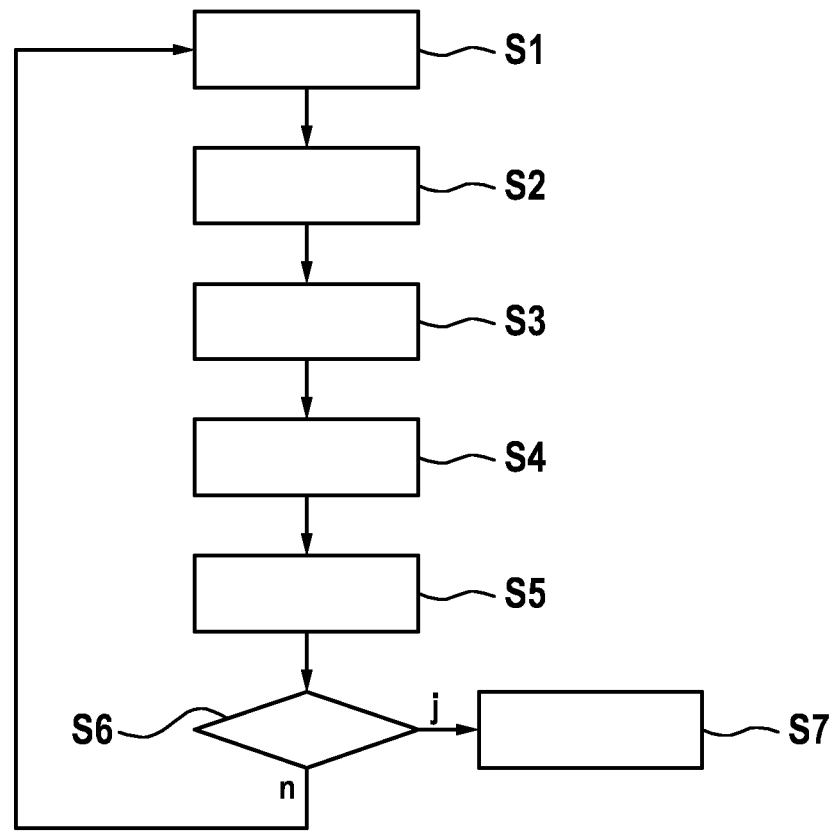
FIG. 2 shows an advantageous method for operating the voltage converter.

In this respect, FIG. 2 shows a flowchart for explaining the advantageous diagnostic method which begins in step S1, for example with the activation of the voltage converter 1. In a subsequent step S2, the input voltage, the output voltage as well as the operating current and the instantaneous temperature of the converter strand 4 are determined. The temperature sensor 6 is used to determine the temperature and sensors which are present in the converter strand 4 anyway are preferably used to determine the voltage and current values. In a subsequent step S3, a coolant temperature T_1 of the coolant 9 in the region of the converter strand 4 is calculated on the basis of the values determined in step S2. A temperature model which allows a simple and prompt calculation of the coolant temperature T_1 is advantageously used for this purpose.

In a subsequent step S4, the input voltage, output voltage and operating current and the temperature of the converter strand 5, as captured by the temperature sensor 7, are captured or read in. In the subsequent step S5, the coolant temperature T_2 of the coolant in the region of the converter strand 5 is determined from the values determined in step S4, in particular by means of a further temperature model. Steps S2, S3 and S4, S5 are optionally carried out in a parallel manner.

In a query S6, the determined coolant temperatures T_1 and T_2 are then compared with one another. In this case, a deviation of the coolant temperatures T_1, T_2 from one another is checked, in particular, in which case the deviation is compared with a predefinable tolerance or limit value T_Δ. The limit value T_Δ is selected, in particular, on the basis of whether the cooling device 8 applies the coolant 9 to the converter strands 4, 5 in succession or in a parallel manner. If the coolant is applied to the converter strands 4, 5 in a parallel manner, the limit value is selected to be lower.

If the comparison of the coolant temperatures exceeds the limit value, it is identified that one of the temperature sensors 6, 7 has a malfunction. It is assumed that the coolant temperatures determined or calculated by means of the temperature values would have to be the same or virtually the same. If the difference between the coolant temperatures T_1, T_2 exceeds the limit value (j), however, this is an indication that one of the temperature sensors 6, 7 is not operating correctly. Consequently, emergency operation is initiated in a step S7 in which the voltage converter 1 is deactivated, for example, and/or a warning message is output to a driver of the motor vehicle. In particular, the identified fault is also stored.

If the determined temperature difference is below the limit value T_Δ (n), it is identified that the temperature sensors 6, 7 are functioning properly and the method is continued in step S1 or S2.

A coolant temperature of the coolant 9 is optionally additionally captured directly, for example by the cooling device 8, in order to provide a reference value with which the two coolant temperatures T_1 and T_2 can be compared. As a result, it is not only possible to identify a malfunction of the voltage converter 1, but also to determine which of the two temperature sensors 6, 7 has the malfunction. This has the advantage that only the converter strand 4, 5 having the defective temperature sensor 6 or 7 is deactivated for the emergency operating mode, for example, with the result that continued operation of the voltage converter is fundamentally possible.

The invention claimed is:

1. A method for operating a voltage converter (1) of a motor vehicle, the voltage converter (1) having at least two converter strands (4, 5) which are connected in parallel and are connected between a high-voltage side (2) and a low-voltage side (3) of the voltage converter (1) for converting the voltage, at least one cooling device (8) which carries a coolant (9) and is assigned to the converter strands (4, 5), and at least one temperature sensor (6, 7) assigned to each of the converter strands (4, 5), the method comprising the following steps:
 a) capturing an input voltage, an output voltage and an operating current of each converter strand (4, 5),
 b) capturing an instantaneous converter strand temperature by means of the respective temperature sensors (6, 7),
 c) determining a coolant temperature for each converter strand on the basis of the values captured in steps a) and b),
 d) comparing the two determined coolant temperatures ($T\_1$, $T\_2$) with one another, and
 e) determining the functionality of the temperature sensors (6, 7) on the basis of the result of the comparison.

2. The method as claimed in claim 1, wherein the coolant temperatures ($T\_1$, $T\_2$) are calculated by means of a temperature model in each case.

3. The method as claimed in claim 1, wherein the functionality of the temperature sensors is identified when the determined coolant temperatures ($T\_1$, $T\_2$) are the same or virtually the same.

4. The method as claimed in claim 1, wherein a functional fault is identified when the determined coolant temperatures differ from one another beyond a predefinable limit value.

5. The method as claimed in claim 1, wherein the voltage converter or a control unit having the voltage converter is switched to a safe emergency operating mode if a functional fault is identified.

6. The method as claimed in claim 1, wherein a further coolant temperature is captured and is compared with the determined coolant temperatures ($T\_1$, $T\_2$) in order to determine which of the two temperature sensors (6, 7) has a malfunction.

7. The method as claimed in claim 6, wherein the further coolant temperature is measured.

8. A device for operating a voltage converter (1) having:
 at least two converter strands (4, 5) which are connected in parallel and are connected between a high-voltage side and a low-voltage side of the voltage converter (1) for converting the voltage and having at least one cooling device (8) which carries a coolant and is assigned to the converter strands (4, 5), wherein at least one temperature sensor (6, 7) is assigned to each of the converter strands (4, 5), and
 a control unit (10) configured to carry out the method as claimed in claim 1.

* * * * *